United States Patent [19]

Mori et al.

[11] Patent Number: 5,124,939
[45] Date of Patent: Jun. 23, 1992

[54] SIGNAL MODIFICATION CIRCUIT

[75] Inventors: Ryoichi Mori, 24-12, Hakusa 1-chome, Bunky-ku, Tokyo; Kazuo Toraichi, Sayamashi; Masaru Kamada, Tsukuba, all of Japan

[73] Assignee: Ryoichi Mori, Tokyo, Japan

[21] Appl. No.: 383,359

[22] Filed: Jul. 20, 1989

[30] Foreign Application Priority Data

Jul. 23, 1988 [JP] Japan ................................ 63-183872
Jul. 23, 1988 [JP] Japan ................................ 63-183873

[51] Int. Cl.⁵ ..................... H03H 15/02; G06G 7/30
[52] U.S. Cl. .................................. 364/602; 333/166; 364/825
[58] Field of Search ............. 364/602, 604, 819, 824, 364/825, 853; 333/166, 173, 175, 176; 381/51

[56] References Cited

U.S. PATENT DOCUMENTS

| | | | |
|---|---|---|---|
| 3,340,875 | 7/1982 | English | 333/166 |
| 3,801,934 | 4/1974 | Van Gerwen | 333/166 |
| 4,106,103 | 8/1978 | Perreault | 364/827 |
| 4,597,318 | 7/1986 | Nikaido et al. | 381/51 X |
| 4,633,184 | 12/1986 | Charles | 328/55 |
| 4,805,126 | 2/1989 | Rodems | 364/571.01 |

OTHER PUBLICATIONS

H. Dunn et al., "Artificial speech in phonetics and communications", *Journal of Speech and Hearing Research*, vol. 1, No. 1, Mar. 1958, pp. 23–29.
L. Franks et al., "An Alternative Approach to the Realization of Network Transfer Functions: The N-Path Filter", *Bell System Technical Journal*, Sep. 1960, pp. 1321–1350.
B. Chuvykin, "Spline–Interpolating Filter", *Instrum. & Exp. Tech*, vol. 23, No. 1 pt. 2, Jan.–Feb. 1980, Plencom Publishing, pp. 148–150.
Kamada, M. et al., "Effects of ultrasonic components on perceived tone quality", *Proceedings of 1989 IEEE International Conference on Acoustics, Speech, and Signal Processing*, pp. 1997–2000, (May 1989).

*Primary Examiner*—Stephen M. Baker
*Attorney, Agent, or Firm*—W. G. Fasse; D. H. Kane, Jr.

[57] ABSTRACT

A signal modification circuit receives an input signal and produces an output having a modified characteristic. When the signal modification circuit is embodied in an audio circuit receiving an analog audio signal having a first variant level at its input, the audio circuit produces an output signal having a second variant level in which a frequency characteristic in a high frequency range is modified so that the second variant level decreases in accordance with a function of $1/f^m$ (f being frequency and m being an integer determined depending upon the nature of the audio signal) relative to the first variant level while being trapped in selected discrete frequencies. For this purpose a combination of a low-pass filter and a plurality of trap filters connected in series with one another, or a combination of a low-pass filter and a plurality of band-pass filters connected in parallel to one another. Instead, a convolution operating circuit is used which performs a convolution operation between an input digital signal and a unitary impulse response signal. In accordance with such audio circuit, the local position of musical sounds is stabilized and the articulation of spoken words is improved. The signal modification circuit according to the invention is also applicable to digital-to-analog converting circuit.

2 Claims, 11 Drawing Sheets

DISCRETE SIGNAL

CONTINUOUS SIGNAL

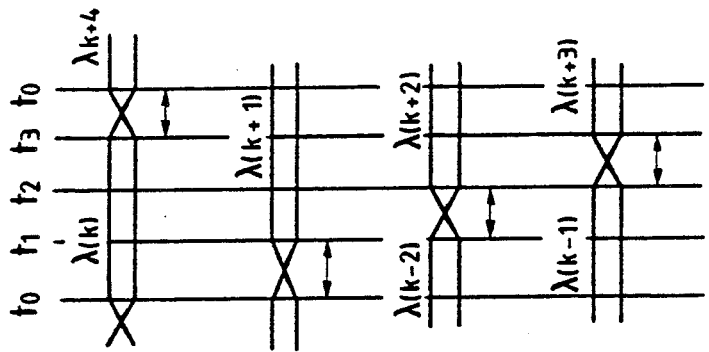
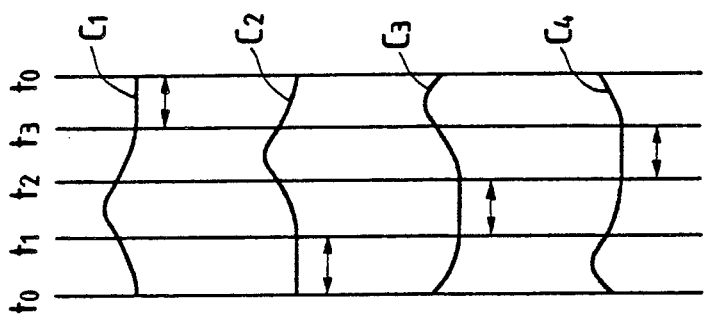
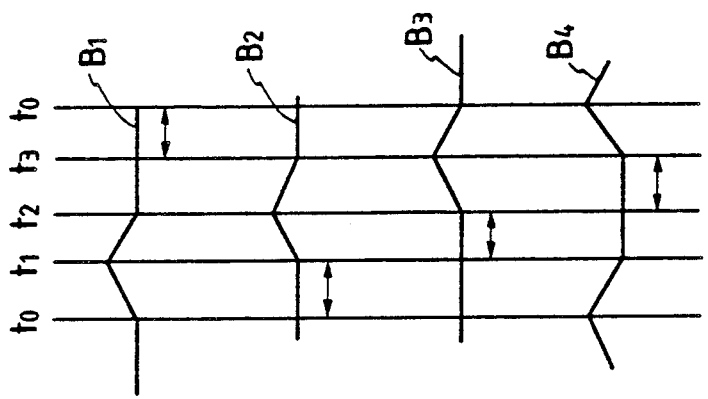
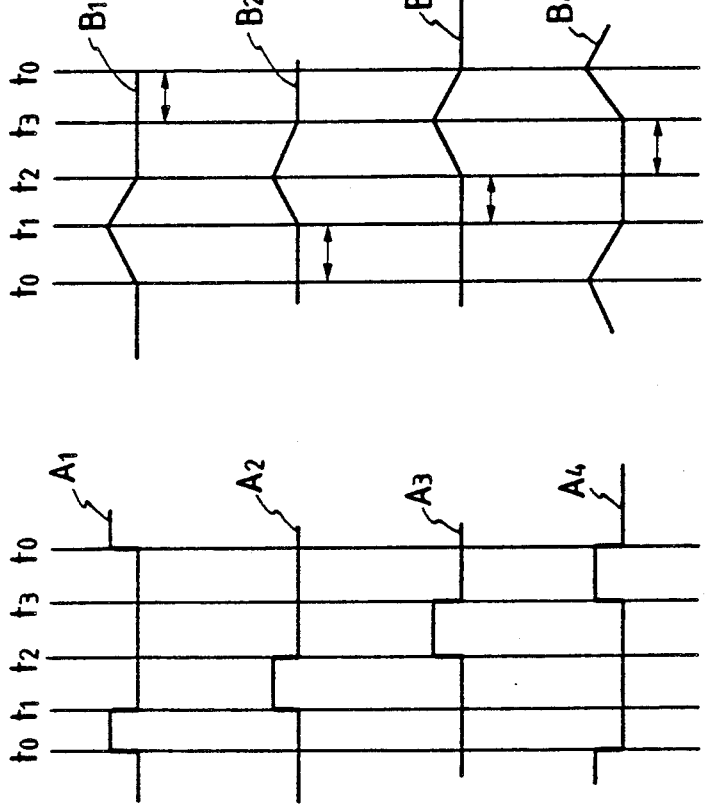

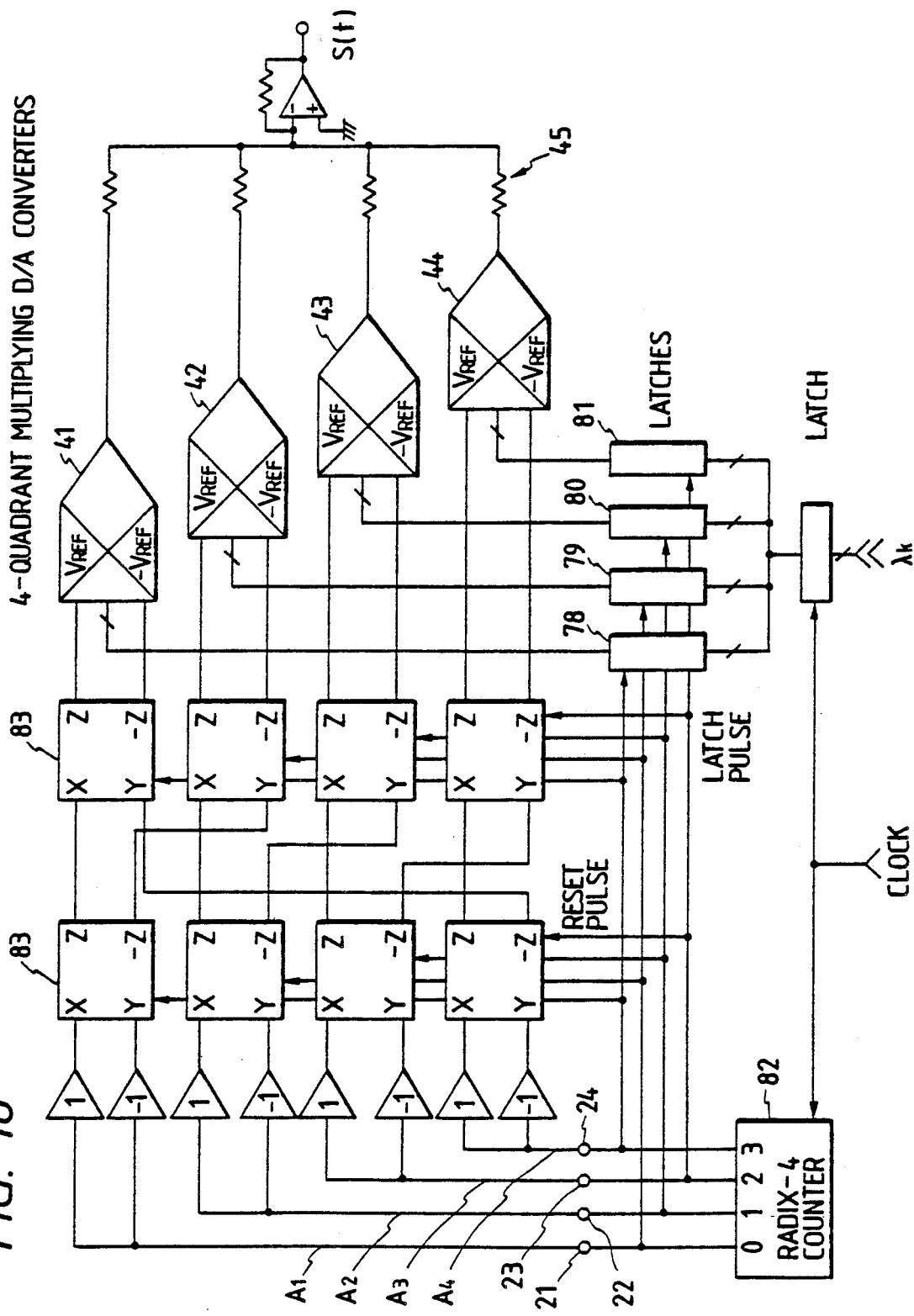

1

SIGNAL MODIFICATION CIRCUIT

FIELD OF THE INVENTION

The present invention relates generally to signal modification circuits for modifying an input signal and providing a modified output signal. More specifically, the invention relates to an audio circuit providing a modified frequency characteristic.

BACKGROUND INFORMATION

A number of audio circuits have heretofore been used in digital audio disk reproducing devices or audio amplifiers, some of which are well known as those are named specifically. In terms of frequency characteristics, such audio circuits have been designed under a presumption that a frequency band audible by human ears is in a range from about 20 Hz to 20 kHz. There are some audio circuits which cover frequencies higher than 20 kHz, however, those circuits are designed so that the frequency response curve becomes substantially flat for frequencies higher than 20 kHz similar to the curve in frequencies below 20 kHz.

According to research performed by the present inventors, it has been found that the audible frequency band of the human ears generally extends to frequencies much higher than 20 kHz. Moreover, depending upon how the audio frequencies higher than 20 kHz are electrically dealt with, the reproduced sounds perceived by the human ears are differentiated. For example, if frequencies higher than 20 kHz are properly reproduced, the local position of a musical sound image is stabilized, or the articulation of spoken words is improved.

SUMMARY OF THE INVENTION

The present invention has been made in view of the foregoing, and it is an object of the invention to provide a signal modification circuit for modifying an input signal and providing a modified output signal.

It is another object of this invention to provide an audio circuit for producing a modified frequency characteristic when reproducing audio signals, to stabilize the local position of a musical sound image and to improve the articulation of spoken words.

In order to achieve these and other objects, according to one aspect of the invention, there is provided a signal modification circuit for modifying a first signal and providing a modified second signal, comprising an input terminal receiving the first signal having a first variant level in frequency domain, filtering means connected to the input terminal for filtering the first signal in a predetermined frequency range to provide the second signal having a second variant level which decreases in accordance with a function of $1/f^m$ relative to the first variant level of the first signal, where f is a frequency and m is an integer, the second variant level being substantially trapped in selected discrete frequencies within the predetermined frequency range, and an output terminal for outputting the second signal. The first and second signals are analog signals, and the first signal is carried by a low frequency range lower in frequency than a predetermined value and a high frequency range higher in frequency than the predetermined value. One example of the filtering means comprises, as shown in FIG. 1, a low-pass filter (2) having an input connected to the input terminal (1) and an output, the low-pass filter (2) having a filtering characteristic for passing signals of the low frequency range and for attenuating signals of the high frequency range in accordance with the function of $1/f^m$ where f is the frequency and m is the integer, a plurality of trap filters (31, 32, ..., 3n) cascade-connected to one another a first trap filter (31) to an n-th trap filter (3n), the first trap filter (31) being connected to the output of the low-pass filter (2) and the n-th trap filter (3n) being connected to the output terminal (4), wherein the plurality of trap filters (31, 32, ..., 3n) have trap characteristics for trapping the second variant level in the selected discrete frequencies. Another example of the filtering means comprises, as shown in FIG. 3, a low-pass filter (5) having an input connected to the input terminal (1) and an output, the low-pass filter (5) having a filtering characteristic for passing signals of the low frequency range and attenuate signals of the high frequency range in accordance with the function of $1/f^m$ where f is the frequency and m is the integer, and a plurality of band-pass filters (61, 62, ..., 6n) connected in parallel to one another, the parallel connection of the plurality of band-pass filters (61, 62, ..., 6n) having an input connected to the input terminal (1) and an output, wherein the plurality of band-pass filters (61, 62, ..., 6n) have band pass characteristics for passing the first variant signal in the high frequency range and precluding the selected discrete frequencies, and further comprising an adder (7) having inputs connected to the outputs of the low-pass filter (5) and the plurality of band-pass filters (61, 62, ..., 6n) for adding the signals passed therethrough, and an output connected to the output terminal.

According to another aspect of the invention, there is provided, as shown in FIG. 5, a signal modification circuit for modifying a digital signal and providing a modified analog signal, comprising, convolution operating means (12) having a first input terminal (10) receiving the digital signal in a time domain, a second input terminal (11) receiving an impulse response signal, and an output terminal (13), the convolution operating means (12) performing a convolution operation with respect to the digital signal and the impulse response signal for producing the modified analog signal on the output terminal (13), wherein the digital signal has a first variant level in a time domain and the analog signal has a second variant level in a frequency domain, the second variant level decreasing in accordance with a function of $1/f^m$ relative to the first variant level where f is a frequency and m is an integer, the second variant level being substantially trapped in selected discrete frequencies within a predetermined frequency range. The digital signal is in the form of a discrete signal as shown in FIG. 6A, and the impulse response signal lies in a time domain as shown in FIG. 6B.

According to still another aspect of the invention, there is provided, as shown in FIG. 8, a signal modification circuit for modifying a digital signal M(k) and providing a modified analog signal S(t) as shown in FIG. 10, the digital signal M(k) being in the form of a discrete signal having a quantized variant level in time domain as shown in FIG. 10, comprising, means for providing a predetermined number of sequentially occuring discrete signals (M(k) through M(k−10)) at a time, coefficient registration means (57 through 67) having a plurality of preselected coefficients (k1 through k11) corresponding to the predetermined number of the discrete signals, the coefficient registration means multiplying each of the preselected coefficients (k1 through k11) and the corresponding discrete signal (M(k) through M(k−10)) and providing first multiple signals, first adding means (68 through 77) for adding the first multiple signals provided from the coefficient registration means (57 through 67) and providing a second discrete signal λ (k) corresponding to the predetermined number of sequentially occuring discrete signals (M(k) through M(k − 10), a plurality of the second discrete signals λ (k) occurring at every predetermined period of time, reference signal producing means for producing a preselected number of reference signals (C1 through C4), the preselected number of reference signals (C1 through C4) being produced in timed relation to the occurrence of the second discrete signals λ (k), multiplying means including a preselected number of multipliers (41 through 44) in association with the preselected number of reference signals (C1 through C4), each of the preselected number of multipliers having two inputs, one receiving the associated reference signal (C1 through C4) and another receiving the associated second discrete signal λ (k), the preselected number of multipliers (41 through 44) multiplying the reference signal (C1 through C4) and the second discrete signal λ (k) inputted thereto and providing second multiple signals, and second adding means (45) for adding the second multiple signals and providing the analog signal. The reference signal producing means comprises, a preselected number of channels (A1 through A4) provided in association with the preselected number of reference signals (C1 through C4), each channel receiving clocks delayed by a predetermined time from those of adjacent channel, a preselected number of first subtractors (25 through 28) connected in one-to-one correspondence to the preselected number of channels (A1 through A4), each first substractor subtracting a clock signal on the adjacent channel from the clock signal on the associated channel and outputting a first subtraction signal, a preselected number of first integrators (29 through 32) connected in one-to-one correspondence to the preselected number of first substractors (25 through 28) for integrating the first subtraction signals and outputting first integration signals, a preselected number of second subtractors (33 through 36) connected in one-to-one correspondence to the preselected number of first integrators (29 through 32), each second subtractor subtracting the first integration signal outputted by the adjacent first integrator, from the first integration signal outputted by the associated second subtractor and outputting a second subtraction signal, and a preselected number of second integrators (37 through 40) connected in one-to-one correspondence to the preselected number of second subtractors (33 through 36) for integrating the second subtraction signals and outputting the preselected reference signals (C1 through C4). The means for providing said discrete signals comprises an input terminal (46) for receiving the digital signal M(k), and a plurality of delay circuits (47 through 56) having a number reduced by one with respect to the number of the sequentially occuring discrete signals included within a predetermined period of time, each of the plurality of delay circuits imposing a delay time, the plurality of delay circuits (47 through 56) being connected in series to the input terminal (46) so that the discrete signals are sequentially delayed by the delay time.

When the signal modification circuits as arranged above, are used as an audio circuit for modifying frequency characteristics in a high frequency range, the local position of a musical sound image is stabilized and the articulation of spoken words is improved.

BRIEF DESCRIPTION OF THE DRAWINGS

In the drawings:

FIGS. 9A through 9D are waveform diagrams for description of the operation of the circuit shown in FIG. 8;

FIG. 16 is yet another modified circuit diagram of the circuit shown in FIG. 8.

DETAILED DESCRIPTION OF THE PREFERRED EXAMPLE EMBODIMENTS AND OF THE BEST MODE

Preferred embodiments of the present invention will be described with reference to the accompanying drawings. The terms "low frequency range" and "high frequency range" will be used throughout the specification. The term "low frequency range" generally means a frequency range lower in frequency than about 20 kHz if not specified particularly. The term "high frequency range" generally means a frequency range higher in frequency than about 20 kHz if not specified particularly.

Figure 1:
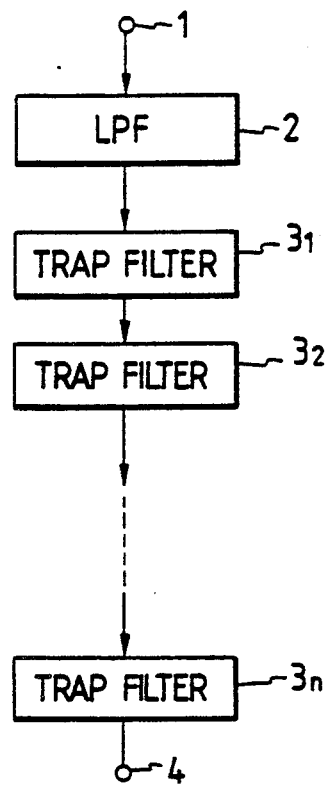
FIG. 1 is a block diagram showing an audio circuit according to a first embodiment of the present invention.
Figure 2A:
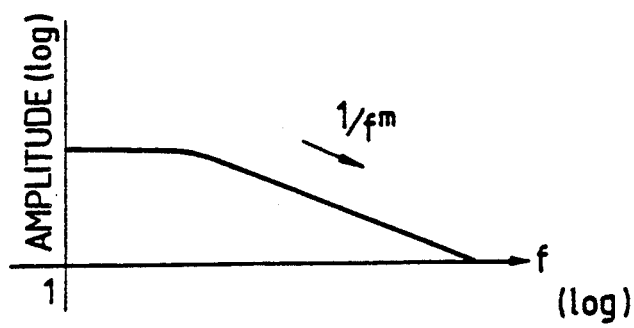
FIGS. 2A through 2D are waveform diagrams for describing the operation of the circuit shown in FIG. 1.

FIG. 1 is a block diagram showing an audio circuit according to a first embodiment of the present invention, in which a low-pass filter 2 and trap filters 31, 32, ..., 3n are connected in series between an input terminal 1 and an output terminal 4. In FIG. 1, an analog audio signal reproduced by a digital audio disk reproducing device or collected by a microphone is applied to the input terminal 1. After passing through the low-pass filter 2, the audio signal is successively passed through the trap filters 31, 32, ..., 3n, and is outputted by the output terminal 4. The outputted audio signal is amplified by an output amplifier (not shown) and an audible sound perceivable by human ears emanates from a loudspeaker (not shown). As shown in FIG. 2A, the low-pass filter 2 has a characteristic such that the amplitude of the audio signal is held substantially flat in a low frequency range but in a high frequency range the amplitude thereof decreases or attenuates as the frequency increases. The frequency shifting from the flat characteristic to the attenuating characteristic is set to about 20 kHz. In the high frequency range, the amplitude A decreases in accordance with a function of $1/f^m$ where m is an integer and f is a frequency. The integer m is, for example, selected as 1 (one) with respect to musical sounds, 2 (two) with respect to spoken Japanese sounds, and 3 (three) with respect to spoken English sounds. The low-pass filter imposing the above function is constituted, for example, with a well known CR circuit.

Figure 2B:
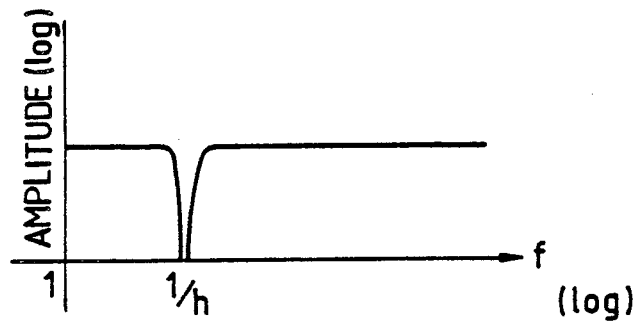
Figure 2C:
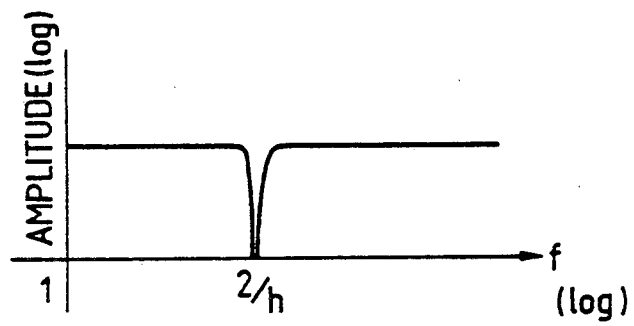
Figure 2D:
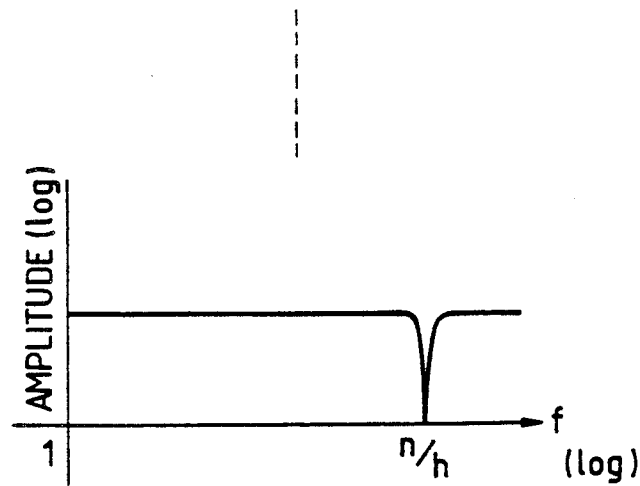

The trap filters 32 through 3n have trap characteristics as shown in FIGS. 2B through 2D. Specifically, the trap filters 32, 33, ..., 3n have center frequencies which attenuate frequencies of 1/h, 2/h, ..., n/h, respectively, where the factor h is a natural number defined by:

$$h = 1/(20\ \text{kHz} \times 2).$$

Such trap filters are constituted, for example, with well known CR circuits.

Figure 7:
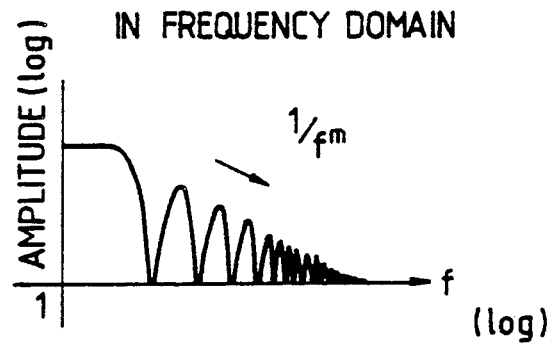
FIG. 7 is a diagram showing an input/output characteristic of the circuits shown in FIGS. 1, 3 and 5.

The combination of the low-pass filter 2 and the trap filters 31, 32, ..., 3n lying in the frequency domain are shown in FIG. 7. The combination of the low-pass filter 2 and the trap filters 31 through 3n provide a flat characteristic in the low frequency range and attenuating characteristics in the high frequency range, whereby the attenuating takes place in accordance with a function of $1/f^m$ and being trapped in selected discrete frequencies. Due to such a frequency characteristic, the local position of a sound image is stabilized and the articulation of the spoken words is improved.

Figure 3:
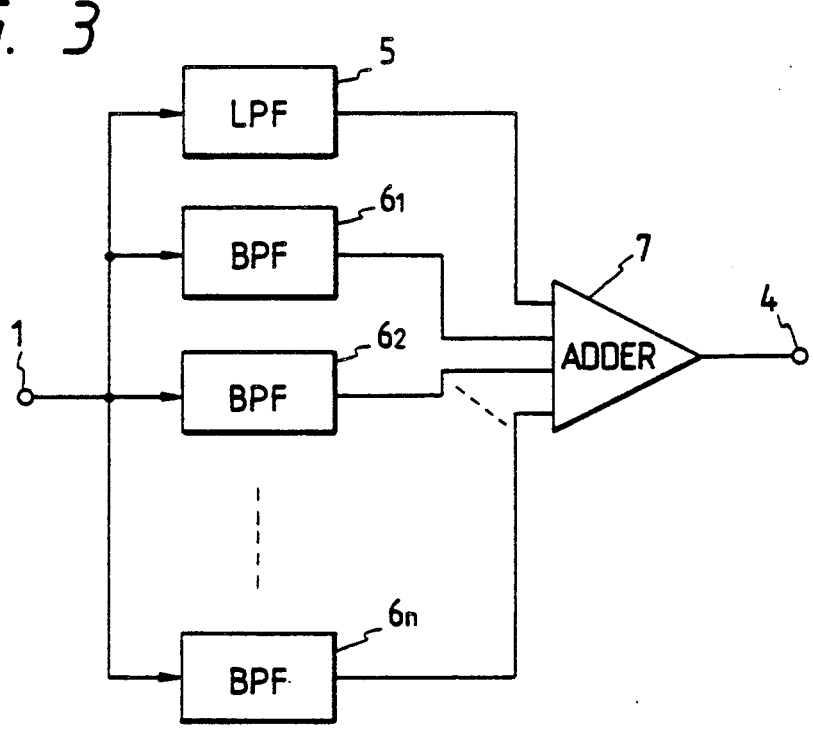
FIG. 3 is a block diagram showing an audio circuit according to a second embodiment of the present invention.

FIG. 3 is a block diagram showing an audio circuit according to a second embodiment of the present invention, in which a low-pass filter 5 and band-pass filters 61, 62, ..., 6n are connected in parallel to an input terminal, the outputs of said filters are connected to the input of an adder 7, and the output of the adder 7 is in turn connected to the output terminal 4.

Similar to the first embodiment shown in FIG. 1, an analog audio signal reproduced from a digital audio disk or collected, for example, by a microphone, is applied to the input terminal 1. The audio signal is passed through the low-pass filter 5 and through each of the band pass filters 61 through 6n. The output from said filters are added up in the adder 7 and the resultant signal is outputted by the output terminal 4. The output signal is then amplified by an output amplifier (not shown) and an audible sound perceivable by human ears emanates from a loudspeaker (not shown).

Figure 4A:
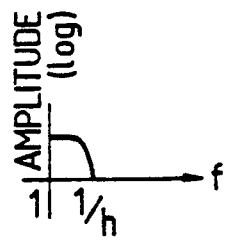
FIGS. 4A through 4D are waveform diagrams for describing the operation of the circuit shown in FIG. 3.
Figure 4B:
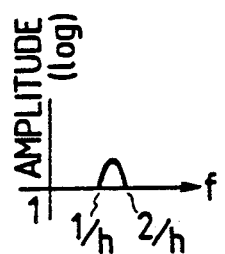
Figure 4C:
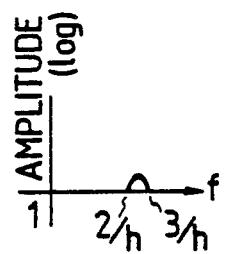
Figure 4D:

The low-pass filter 5 has such a characteristic as to pass only signals of a low frequency range as shown in FIG. 4A. The low-pass filter 5 is constituted, for example, with a well known CR circuit. The frequency at which the level or the amplitude of the audio signal is abruptly lowered, is set to about 20 kHz or 1/h where h is defined the same as set forth above. The band-pass filters 61, 62, ..., 6n have attenuating characteristics such as shown in FIGS. 4B, 4C and 4D in which the center frequency of each band-pass filter is located in a middle position between 1/h and 2/h, 2/h and 3/h, and, n−1/h and n/h, respectively. Such trap filters are constituted, for example, with well known CR circuits.

An input/output characteristic between the audio signal applied to the input terminal 1 and the sum signal of the outputs of the low-pass filter 5 and the band-pass filters 61, 62, ..., 6n appearing at the output terminal 4, are shown in FIG. 7. As the first embodiment in FIG. 1, the amplitude of the output signal decreases in accordance with a function of $1/f^m$ where the integer m is selected to 1 (one) with respect to musical sounds, 2 (two) with respect to spoken Japanese sounds, and 3 (three) with respect to spoken English sounds.

The combination of the low-pass filter 5 and the band-pass filters 6 provides a flat characteristic in the low frequency range and an attenuating characteristics in the high frequency range, whereby the attenuation takes place in accordance with a function of $1/f^m$ and being trapped in selected discrete frequencies, with the result that the local position of the sound image is stabilized and the articulation of the orally spoken words is improved.

Figure 5:
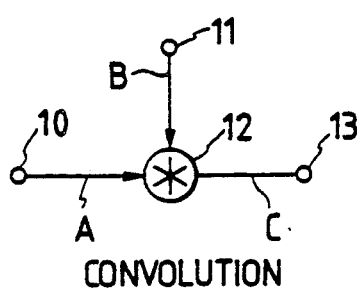
FIG. 5 is a block diagram showing an audio circuit according to a third embodiment of the present invention.

FIG. 5 is a block diagram showing an audio circuit according to a third embodiment of the present invention. While the audio circuits shown in FIGS. 1 and 3 receive an analog audio signal in their inputs, the audio circuit according to the third embodiment receives a digital audio signal which is reproduced by, for example, a digital audio disk or a digital audio tape. The audio circuit of the third embodiment includes a convolution operating circuit 12 having two input terminals 10 and 11 and an output terminal 13.

Figure 6A:
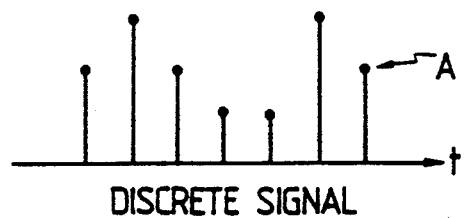
FIGS. 6A through 6C are waveform diagrams for describing the operation of the circuit shown in FIG. 5.
Figure 6B:
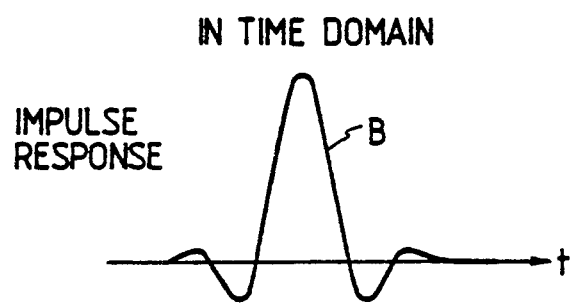
Figure 6C:
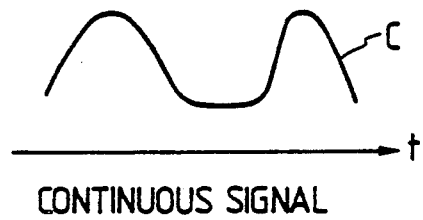

A digital audio signal A in the form of a discrete signal as shown in FIG. 6A is subjected to sampling and quantization and applied to the input terminal 10. On the other hand, a unitary impulse response signal B lying in the time domain, as shown in FIG. 6B is applied to the input terminal 11. These signals A and B are subjected to a convolution operation in the convolution operation circuit 12. As a result, an analog continuous signal C as shown in FIG. 6C is outputted from the output terminal 13. The signal C is amplified by an output amplifier (not shown) and an audible sound perceivable by the human ears emanates from a loudspeaker (not shown).

An input/output vs. frequency characteristic as shown in FIG. 7 is obtained from the input signal applied to the input terminal 10 and from the output signal appearing at the output terminal 13 as shown in FIG. 7. The factor m can be adjusted by varying the waveform of the unitary impulse response signal B applied to the input terminal 11. As the foregoing embodiments, the integer m is selected as 1 (one) with respect to musical sounds, 2 (two) with respect to spoken Japanese sounds, and 3 (three) with respect to spoken English sounds.

As described, the convolution operation of the digital audio signal A and the unitary impulse response signal B provide a flat characteristic in the low frequency range and an attenuating characteristic in the high frequency range attenuating in accordance with a function of $1/f^m$ and being trapped at preselected discrete frequencies, whereby the local position of the sound image is stabilized and the articulation of the spoken words is improved.

Figure 8:
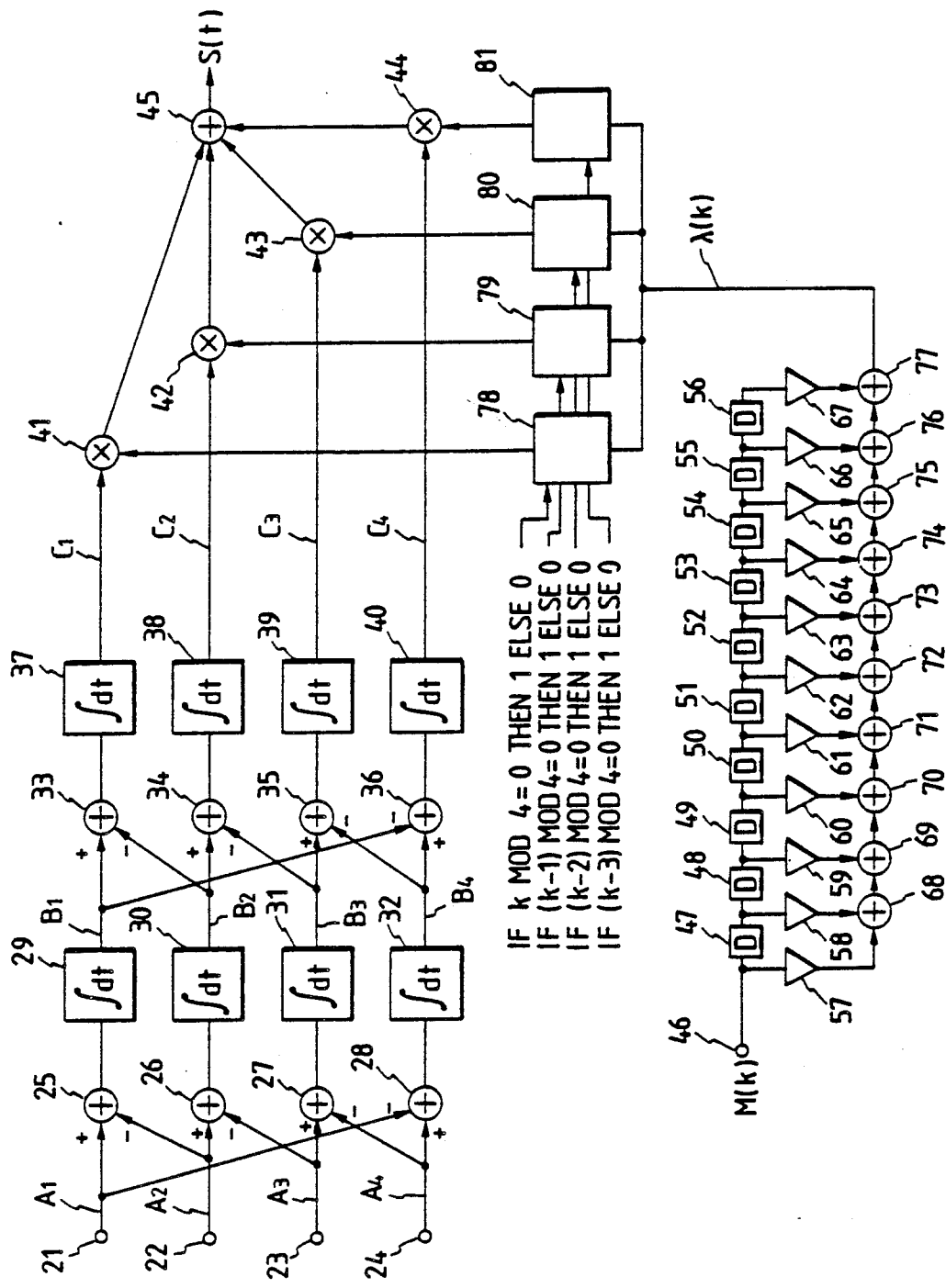
FIG. 8 is a circuit diagram showing an audio circuit according to a fourth embodiment of the present invention.

FIG. 8 is a circuit diagram showing an audio circuit according to a fourth embodiment of the present invention. The circuit of this embodiment receives a digital audio signal as is the case in the third embodiment shown in FIG. 5.

In FIG. 8, signals A1 through A4 having waveforms shown in FIG. 9A are applied to input terminals 21 through 24 of the associated channels, respectively.

Each of the signals A1 through A4 are in the form of impulse signal synchronized with clock signals produced at time instants t0 through t3. The occurrence of each of the impulse signals A1 through A4 are delayed by one clock signal relative to the adjacent channel impulse signals.

The impulse signals A1 through A4 are applied to the associated adder/subtractor 25 through 28. One adjacent channel impulse signal is further applied thereto. Specifically, the impulse signal A1 and its adjacent impulse signal A2 are applied to the adder/subtractor 25 in which the latter signal A2 is applied as a subtraction input thereto. Similarly, the impulse signal A2 and its adjacent impulse signal A3 are applied to the adder/subtractor 26 to which the latter signal A3 is applied as a subtraction input. The impulse signal A3 and its adjacent impulse signal A4 are applied to the adder/subtractor 27 to which the latter signal A4 is applied as a subtraction input. Further, the impulse signal A4 and its adjacent impulse signal A1 are applied to the adder/subtractor 28 to which the latter signal A1 is applied as a subtraction input.

The signals obtained from the adder/subtractors 25 through 28 as a result of addition/subtraction operations are applied to integrators 29 through 32, respectively. The signals obtained from the integrators 29 through 32 are in a triangular waveform such as signals B1 through B4 shown in FIG. 9B. The output signals B1 through B4 of the integrators 29 through 32 are applied to the associated adder/subtractors 33 through 36. Specifically, the impulse signal B1 and its adjacent impulse signal B2 are applied to the adder/subtractor 33 to which the latter signal B2 is applied as a subtraction input. Similarly, the impulse signal B2 and its adjacent impulse signal B3 are applied to the adder/subtractor 34 to which the latter signal B3 is applied as a subtraction input. The impulse signal B3 and its adjacent signal B4 are applied to the adder/subtractor 35 to which the latter impulse signal B4 is applied as a subtraction input. Further, the impulse signal B4 and its adjacent impulse signal B1 are applied to the adder/subtractor 36 to which the latter signal B1 is applied as a subtraction input.

The resultant signals obtained from the adder/subtractors 33 through 36 are applied to the associated integrators 37 through 40. The signals supplied from the integrators 37 through 40 have smoothened waveforms such as indicated respectively with C1 through C4 in FIG. 9C. Each of the signals C1 through C4 has a phase displaced by one clock pulse relative to that of the adjacent channel signal. With respect to the signal C1, the integration constants of the integrators 29 and 37 are determined so that the signal has a peak level in the duration between the time instants t1 and t2 and a smoothly curved waveform in the duration between the time instants t0 and t3. With respect to the remaining signals, the integration constants of the associated integrators are similarly determined. The above-described circuit elements necessary for producing the signals C1 through C4 are referred to as "reference signal producing means" in the present claims.

The signals C1 through C4 are applied to multiplier-D/A converters 41 through 44 where those signals are subjected to A/D conversion and the resultant signals are multiplied by the output signals from the associated latch circuits 78 through 81 to be described later.

Figure 10:
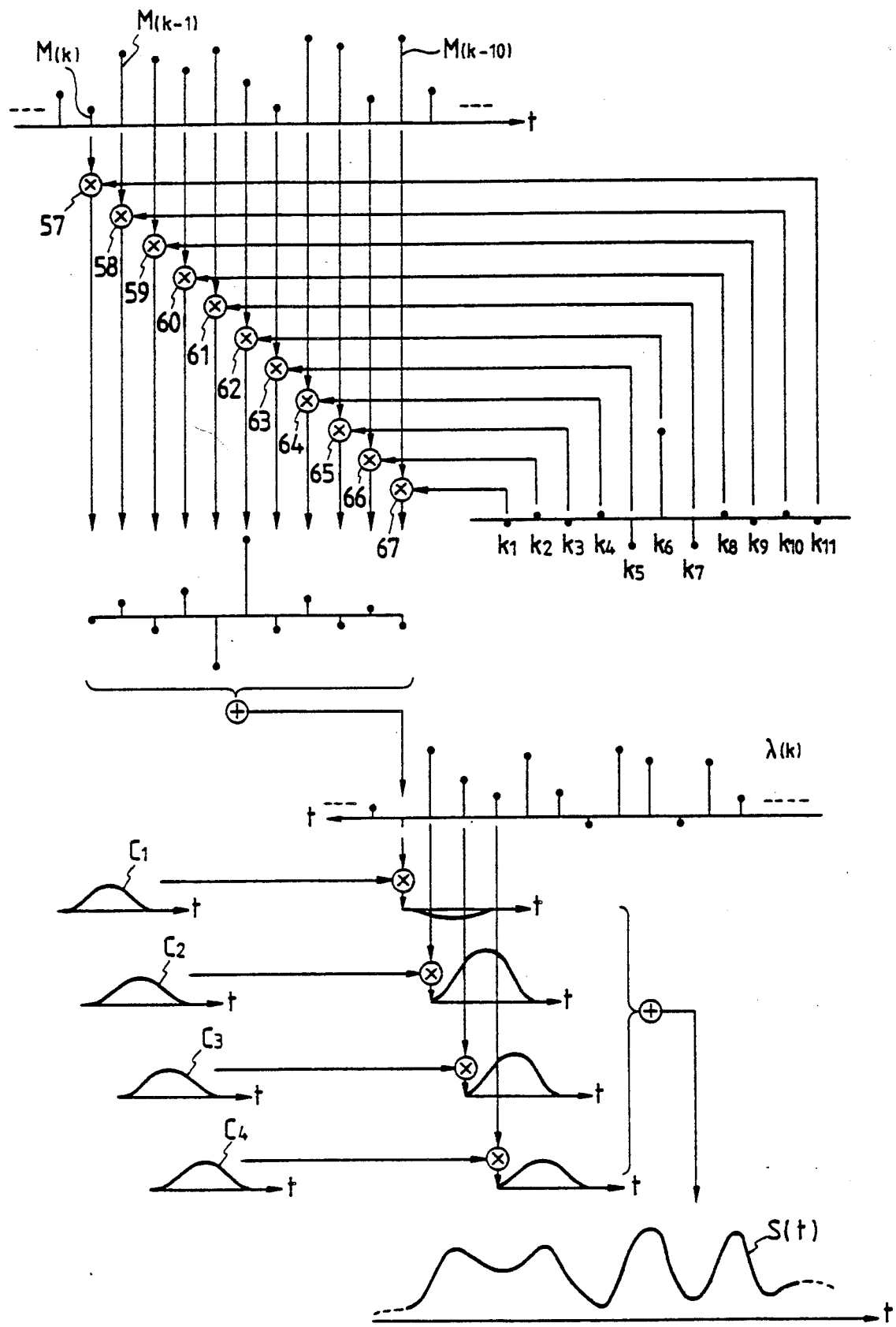
FIG. 10 is a diagram for description of the operation of the circuit shown in FIG. 8.

On the other hand, a digital signal M(k) is applied to the input terminal 46. The signal M(k) is a discrete signal having a quantized variant level in the time domain. The signal M(k) corresponds to the signal A applied to the input terminal 10 of the circuit shown in FIG. 5. The digital signal M(k) is applied successively to delay circuits 47 through 56. The outputs from the delay circuits 47 through 56 are the signals $M(k-1)$ through $M(k-10)$, respectively, as shown in FIG. 10. The input terminal 46 and the delay circuits 47 through 56 correspond to "means for providing a predetermined number of the discrete signal" referred to in the present claims. The signals $M(k-1)$ through $M(k-10)$ and the signal $M(k)$ are applied to coefficient registration circuits 57 through 67. The delay time imposed to each of the delay circuits 47 through 56 is equal to a sampling period of the digital signal $M(k)$. Hence, the digital signals $M(k-1)$ through $M(k-10)$ obtained from the outputs of the delay circuits 47 through 56, precede by one to ten sampling periods.

Eleven digital signals $M(k)$ and $M(k-1)$ through $M(k-10)$ are inputted to the associated coefficient registration circuits 57 through 67 where the input signals are multiplied by the respective coefficients k1 through k11. The coefficients k1 through k11 have quantized values, which provide as a whole a unitary impulse response signal as shown in FIG. 10. The coefficients k1 through k11 have, for example, values, $-0.00021$, $+0.00123$, $-0.00714$, $+0.04163$, $-0.24264$, $+1.141421$, $-0.24264$, $+0.04163$, $-0.00714$, $+0.00123$, and $-0.00021$, respectively.

The outputs from the coefficient registration circuits 57 through 67 are sequentially added in adders 68 through 77 to finally provide a single signal $\gamma(k)$. The signal $\gamma(k)$ is sequentially applied to four latch circuits 78 through 81. The latch circuit 78 latches the signal $\gamma(k)$ when dividing k by 4 results in a remainder of 0. Similarly, the latch circuit 79 latches the signal $\gamma(k)$ when dividing k by 4 results in a remainder of 1. The latch circuit 80 latches the signal $\gamma(k)$ when dividing k by 4 results in a remainder of 2. The latch circuit 81 latches the signal $\gamma(k)$ when dividing k by 4 results in a remainder of 3. The timings at which the signal $\gamma(k)$ is latched in the latch circuits 78 through 81 are as shown in FIG. 9D where the signal $\gamma(k)$ is latched during the time instant t3 to t0, the signal $\gamma(k+1)$ during the time instant t0 to t1, the signal $\gamma(k+2)$ during time instant t1 to t2, and the signal $\gamma(k+3)$ during the time instant t2 to t3. In this manner, the signal $\gamma(k)$ is latched in the latch circuits 58 through 61. Once the signal $\gamma(k)$ is separately latched in the corresponding latch circuits, the signal $\gamma(k)$ is supplied to the associated multiplier-A/D converters 41 through 44.

The signals C1 through C4 applied to the associated multiplier-A/D converters 41 through 44 are multiplied by the corresponding output signals from the latch circuits 78 through 81. The resultant signals in the multiplier-A/D converters 41 through 44 are added together in an adder 45 from which an analog signal S(t) corresponding to the digital signal M(k) is outputted. The signal S(t) corresponds to the output signal appearing at the output terminal 13 shown in FIG. 5.

In the circuit of FIG. 8, in order to reset the totaled errors in the integrators 29 through 32 and the integrators 37 through 40, time durations are reserved at which the signals A1 through A4 and the corresponding signals B1 through B4 are zeroed. Specifically, a time duration is reserved for the signals A1 and B1 from the time instant t3 to t0 so that these signals are to be zeroed, a time duration is reserved for the signals A2 and B2 from the time instant t0 to t1 so that these signals are also to be zeroed, a time duration is reserved for the signals A3 and B3 from the time instant t1 to t2 so that these signals are also to be zeroed, and a time duration is reserved for the signals A4 and B4 from the time instant t2 to t3 so that these signals are also to be zeroed. In the case where the totaled errors of the integrators 29 through 32 and the integrators 37 through 40 are negligible, the circuit of FIG. 8 may be scaled down to three channels to thereby reduce the number of the adder/substractors 25 through 28 and the integrators 29 through 32.

Figure 11:
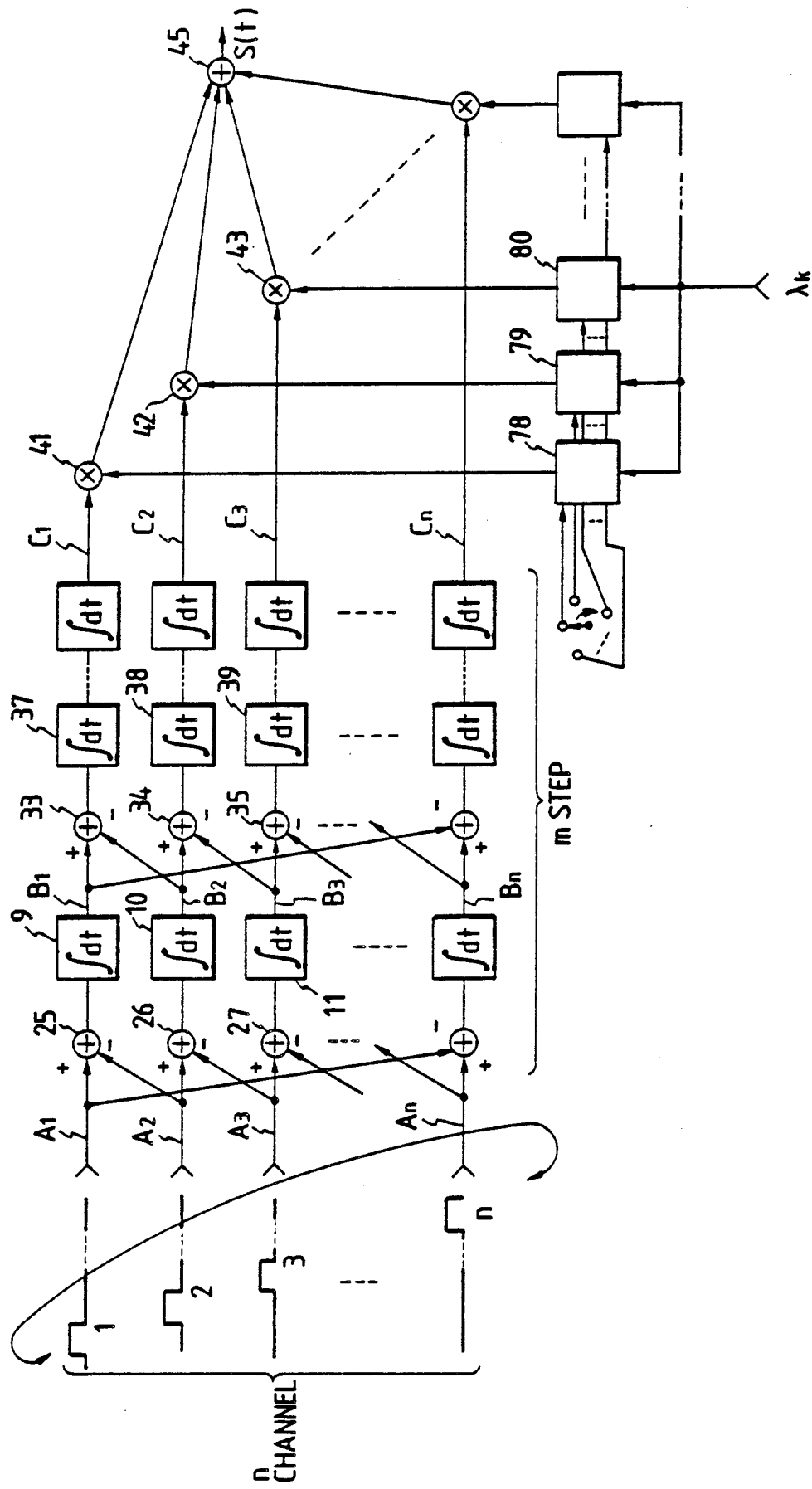
FIG. 11 is a modified circuit diagram of the circuit shown in FIG. 8.
Figure 12:
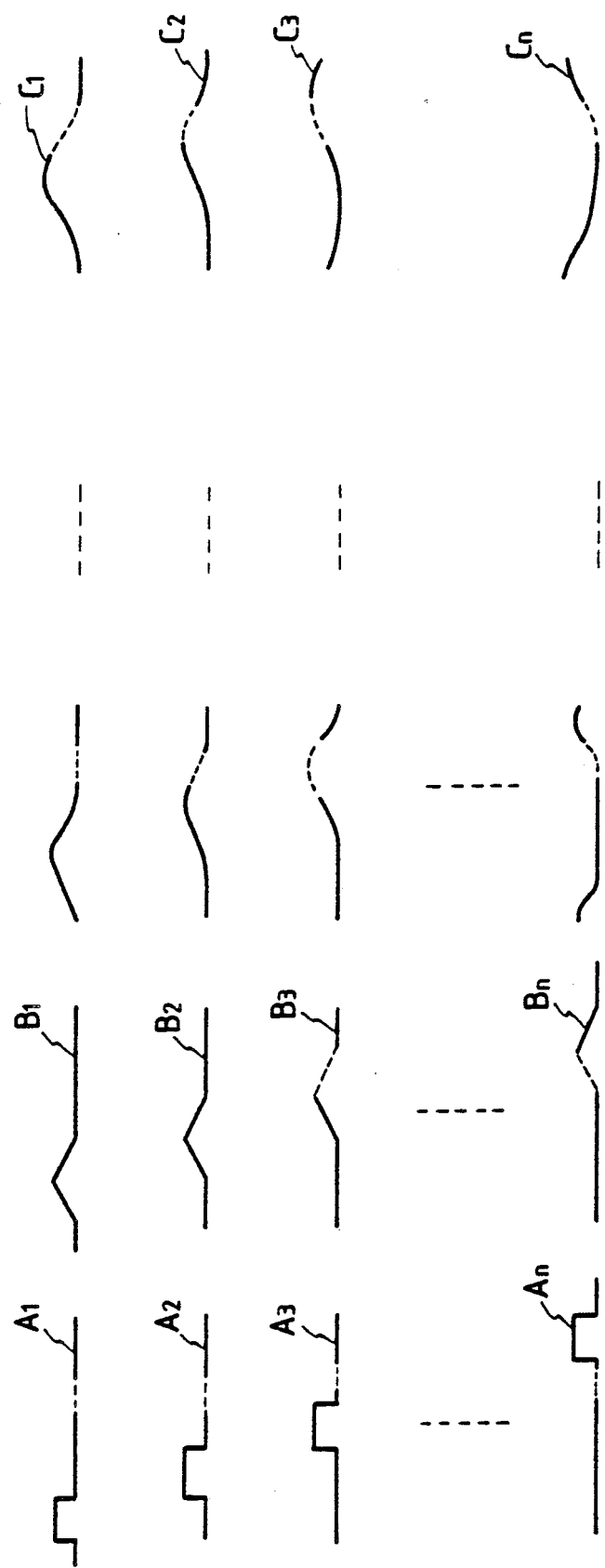
FIG. 12 is a waveform diagram for describing the circuit shown in FIG. 11.

Reversely, the number of the channels and the associated circuit components may be increased so as to obtain a further smoothened output signal. FIGS. 11 and 12 are examples in which the number of the channels is increased to n and the combinations of the adder/subtractor and integrator are provided for m stages. In these figures, the same elements or components as those shown in FIGS. 8 through 11 are denoted by the same reference numerals and a duplicate description thereof is omitted herein.

Figure 13:
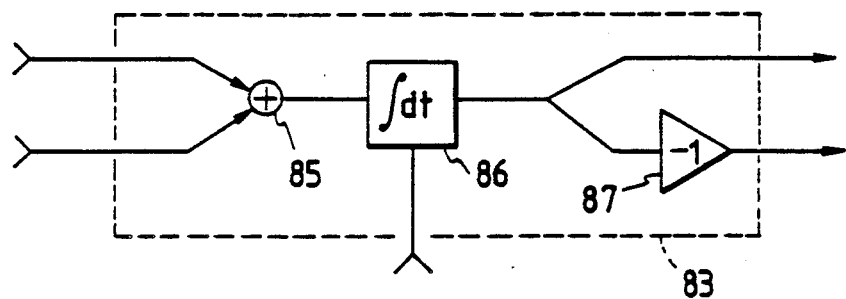
FIG. 13 is another modified circuit diagram of the circuit shown in FIG. 8.
Figure 14:
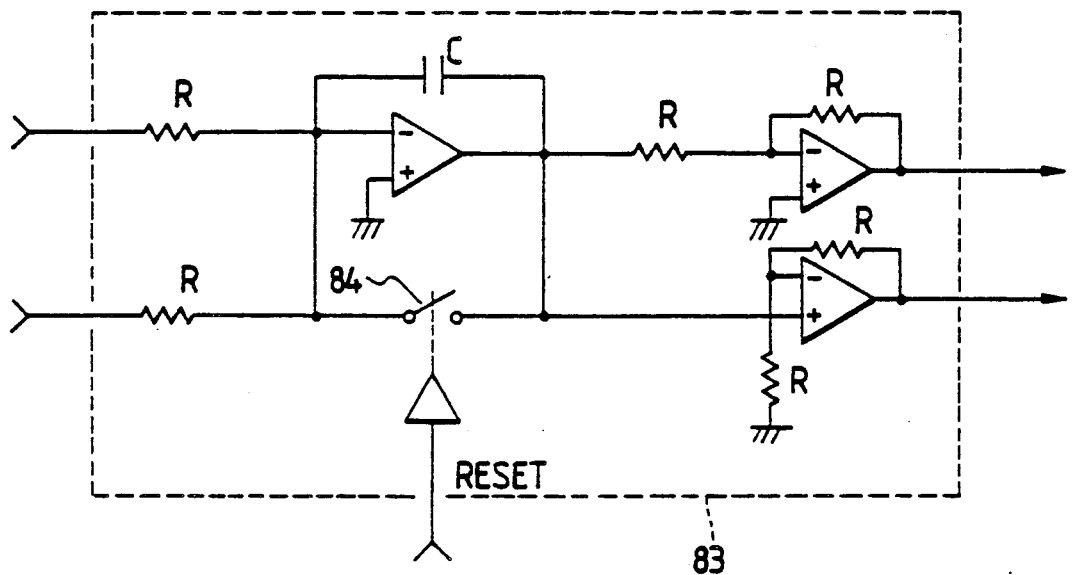
FIG. 14 is further modified circuit diagram of the circuit shown in FIG. 8.
Figure 15:
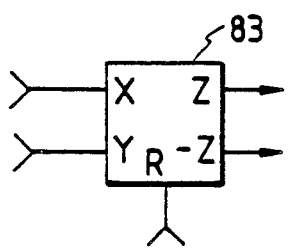
FIG. 15 is still another modified circuit diagram of the circuit shown in FIG. 8.

FIGS. 13 through 16 show circuits modularized to increase the precision of the convolution operating circuit and further to facilitate the manufacture thereof. That is, as shown in FIG. 13, a number of the combinations of the adder/subtractors and the integrators as used in the embodiments of FIGS. 8 or 11 are used each within a module 83. The module 83 comprises a combination of an adder 85, an integrator 86 and an inverting circuit 87. FIG. 14 shows a specific arrangement of the module 83 as such. If depicting the module 83 in the same manner as is done for FIG. 15, the digital to analog converting circuit will be configured as shown in FIG. 16.

The circuit configuration shown in FIG. 16 differs from that shown in FIG. 8 in three points. Firstly, the integrator is positively reset while utilizing a signal for providing a latch instruction to the latch circuits 78 through 81, since a switch 84 for resetting the totaled error developed in the integrator as described previously is provided in the module 84. Secondly, the signals for providing the latch instructions to the latch circuits 78 through 81 and the impulse signals A1 through A4 applied to the input terminals 21 through 24 are produced by a modular four ring counter 82. Thirdly, while in the circuit of FIG. 8, the combination of the adder/subtractor and the integrator are provided in multiple stages, the circuit shown in FIG. 16 is provided with plural stages of the modules 83 each comprising the adder 85, the integrator 86 and the inverting circuit 87 (see FIG. 13).

The remaining features of FIG. 16 are similarly arranged as the circuits shown in FIGS. 8 and 10. Therefore, by denoting the same components or elements by the same reference numerals, the duplicate description thereof is omitted herein.

The present inventors have conducted experiments to analyze the effects of ultrasonic components on perceived tone qualities. Details of the experiment are disclosed in "Effects of ultrasonic componets on perceived tone quality, Proceedings of 1989 IEEE International Conference on Acoustics, Speech, and Signal Processing, pp. 1997–2000, (May 1989).

Although the present invention has been described with reference to embodiments, the present invention may be embodied in other specific forms without departing from the spirit or essential characteristics thereof. The present embodiments are presented merely as illustrative and not restrictive, with the scope of the invention being indicated by the attached claims rather than the foregoing description. All changes which comes within the meaning and range of equivalency of the claims are therefore intended to be embraced therein. For example, the present inventive concept is applicable to digital-to-analog converting circuits. Usually, digital-to-analog converting circuits are such that converting voltages are available only at sampling periods, alternatively, a combination of a holding circuit and an analog filter is used in which the holding circuit produces a signal of a staircase waveform by holding an output voltage until the subsequent voltage is produced and the analog filter serves to smoothen the staircase wave signal. Such digital-to-analog converting circuits are involved with problems such that the signal as obtained lacks accuracy due to the employment of the analog filter. By the application of the present inventive concept, digital-to-analog converting circuits can be realized with the use of the circuits shown in FIGS. 5 and 8. To configure the digital-to-analog converting circuit with the circuit of FIG. 8, it is necessary to modify the circuit so that the coefficient k1 through k11 are all zeroed, alternatively, the coefficient registration circuits 57 through 67 per se are dispensed with.

What is claimed is:

1. A signal modification circuit for modifying a digital signal and providing a modified analog signal, the digital signal being in the form of a discrete signal having a quantized variant level in a time domain, comprising means for providing a predetermined number of sequentially occurring discrete signals at a time; coefficient registration means having a plurality of preselected coefficients corresponding to said predetermined number of the discrete signals, said coefficient registration means multiplying each of the preselected coefficients and the corresponding discrete signal and providing first multiple signals; first adding means for adding the first multiple signals provided by said coefficient registration means and providing a second discrete signal corresponding to the predetermined number of sequentially occurring discrete signals, a plurality of the second discrete signals occurring in every predetermined period of time; reference signal producing means for producing a preselected number of reference signals, said preselected number of reference signals being produced in timed relation to the occurrence of the second discrete signals; multiplying means including a preselected number of multipliers in association with said preselected number of reference signals, each of the preselected number of multipliers having two inputs, one receiving the associated reference signal and another receiving the associated second discrete signal, said preselected number of multipliers multiplying the reference signal and the second discrete signal inputted thereto and providing second multiple signals; second adding means for adding the second multiple signals and for providing said analog signal, and wherein said reference signal producing means comprises a preselected number of channels arranged in association with the preselected number of reference signals, each channel receiving clock signals, delayed by a predetermined time, relative to a clock signal of a neighboring channel; a preselected number of first subtractors connected in one-to-one correspondence to said preselected number of channels, each first subtractor subtracting the clock signal on the neighboring channel from the clock signal on the associated channel and outputting a first subtraction signal; a preselected number of first integrators connected in one-to-one correspondence to said preselected number of first subtractors for integrating the first subtraction signals and outputting first integration signals; a preselected number of second subtractors connected in one-to-one correspondence to said preselected number of first integrators, each second subtractor subtracting the first integration signal outputted from the adjacent first integrator from the first integration signal outputted from the associated second subtractor and outputting a second subtraction signal; and a preselected number of second integrators connected in one-to-one correspondence to said preselected number of second subtractors for integrating the second subtraction signals and outputting said preselected reference signals.

2. The signal modification circuit according to claim 1, wherein said means for providing comprises an input terminal for receiving the digital signal, and a plurality of delay circuits having a number reduced by one with respect to the number of the sequentially occurring discrete signals included within a predetermined period of time, each of said plurality of delay circuits imposing a delay time, said plurality of delay circuits being connected in series to said input terminal so that the discrete signals are sequentially delayed by the delay time.

* * * * *